United States Patent
Barnard (12)

(10) Patent No.: US 6,742,154 B1
(45) Date of Patent: May 25, 2004

(54) FORWARD ERROR CORRECTION CODES FOR DIGITAL OPTICAL NETWORK OPTIMIZATION

(75) Inventor: Chris Barnard, Sunnyvale, CA (US)

(73) Assignee: Ciena Corporation, Linthicum, MD (US)

( * ) Notice: Subject to any disclaimer, the term of this patent is extended or adjusted under 35 U.S.C. 154(b) by 0 days.

(21) Appl. No.: 09/578,995

(22) Filed: May 25, 2000

(51) Int. Cl.[7] .............................................. H03M 13/00
(52) U.S. Cl. ....................................... 714/752; 714/712
(58) Field of Search ............................... 714/775, 762, 714/752, 712; 370/252, 242; 360/53; 359/133

(56) References Cited

U.S. PATENT DOCUMENTS

| | | | | |
|---|---|---|---|---|
| 5,084,891 A | * | 1/1992 | Ariyavisitakul et al. | .... 714/775 |
| 5,473,457 A | | 12/1995 | Ono | |
| 5,526,155 A | | 6/1996 | Knox et al. | |
| 5,657,331 A | * | 8/1997 | Metzner et al. | ............. 714/762 |
| 5,706,281 A | * | 1/1998 | Hashimoto et al. | ......... 370/252 |
| 5,896,391 A | | 4/1999 | Solheim et al. | |
| 5,949,560 A | | 9/1999 | Robert et al. | |
| 6,043,946 A | * | 3/2000 | Genheimer et al. | ........... 360/53 |
| 6,072,990 A | * | 6/2000 | Agrawal et al. | .............. 455/69 |
| 6,433,904 B1 | * | 8/2002 | Swanson et al. | ............ 359/133 |
| 6,549,520 B1 | * | 4/2003 | Gross et al. | ................ 370/242 |

* cited by examiner

Primary Examiner—David Ton
(74) Attorney, Agent, or Firm—Michael R. Cammarata; David Fox; Jason W Rhodes

(57) ABSTRACT

A network optimization method measures the line bit error rate (BER) at a receiver by counting forward error correction corrected errors, and adjusts network parameters to minimize the corrected error rate. Adjustable parameters include, among other things, transmitter extinction ratio, transmitter polarization, and dispersion. The method includes sweeping an adjustable parameter while monitoring the FEC corrected bit error rates at the receiver, and then extrapolating an optimum value of the parameter. In this way, the corrected BER can be maintained below the predetermined BER limit while the digital communication network is in-service.

23 Claims, 5 Drawing Sheets

FORWARD ERROR CORRECTION CODES FOR DIGITAL OPTICAL NETWORK OPTIMIZATION

CROSS-REFERENCE TO RELATED APPLICATIONS

This application is related to copending U.S. application Ser. No. 09/578,996 entitled "Adjustable Dispersion Compensation Module," by C. Barnard, filed concurrently herewith and commonly assigned, which is incorporated herein by reference in its entirety.

FIELD OF THE INVENTION

This invention relates generally to optimization of digital communication networks. More particularly, it relates to using forward error correction for optimization of variable parameters of digital fiber optic communication networks.

BACKGROUND ART

FIG. 1A is a simplified schematic diagram of a conventional single-channel digital communication network 100. A digitized signal 101 is launched from a transmitter 102 through a transmission medium 104, and is received and processed at a receiver 106. Typically, transmission medium 104 is an electrically conducting cable or an optical fiber.

FIG. 1B is a simplified schematic diagram of a conventional multi-channel digital communication network 120. In multi-channel network multiple signals 121a, ..., 121n are launched from respective multiple transmitters 122a, ..., 122n in a transmitter array 132 through a transmission medium 134 having multiple channels 124a, ..., 124n and are received and processed at respective multiple receivers 126a, ..., 126n in a receiver array 136. Transmission medium 134 can be an electrically conducting cable or an optical fiber. Multiple signals 121a, ..., 121n are commonly multiplexed. Particularly, in an optical digital network the multiple signals are commonly multiplexed using a wavelength division multiplex (WDM) technique. Further, in a multiplexed digital network, the multiplexed signals 121a, ..., 121n are commonly amplified between transmitter array 132 and receiver array 136 using a common amplifier 138.

Forward Error Correction (FEC) has been adopted as a standard technique for improving the performance of digital optical communication networks [International Telecommunication Union (ITU) G.975 "Forward error correction for submarine systems" ]. The FEC function comprises a FEC encoder in the transmitter that accepts information bits and adds computed redundant symbols, producing encoded data at a higher bit rate; and a FEC decoder in the receiver that performs the error correction while extracting the redundancy to regenerate the original data.

The FEC function allows in-line monitoring of the line bit-error ratio (BER) before correction through knowledge of the exact number of corrected bits and keeps the system faultless by correcting these errors. Consequently, the FEC function can provide a dynamic evaluation of the system margins relative to the required level of performance. There are various FEC codes, e.g., the (255,239) Reed-Solomon code (ITU G.975), well known in the art, has been adopted by the ITU for submarine fiber systems.

Solheim et al. in U.S. Pat. No. 5,896,391 "Forward Error Correction Assisted Receiver Optimization" issued Apr. 20, 1999, describe a method of setting the eye opening phase and decision level to optimize the BER of a digital communication network. The BER of a digital receiver depends on the decision threshold and phase. For a symmetric eye, and equal noise probabilities on zeros and ones, the ideal decision threshold is the average power level, at the midpoint between the transition points. If the pulses are distorted, or if there is signal-dependent noise, then the optimum decision threshold point may be displaced from the midpoint. The optimum decision threshold and phase of a receiver can be found by sweeping the decision level and phase, in sequence, while monitoring the line BER, then setting the phase and decision level at the point that optimized the FEC.

FEC is typically used to provide significant savings in the overall optical power budget of a fiber link, by allowing the system to operate at a much higher line BER. For example, the (255,239) Reed-Solomon code (cited above) corrects a $10^{-4}$ line BER to $5*10^{-15}$. Thus, with FEC the communication link can support line BER rates up to about $10^{-4}$, report on the high BER in real-time, and correct the errors to better than $10^{-12}$ (a typical target maximum BER for optical communication networks).

Despite the technical advances described above, there is no broadly applicable method for automatic optimization of digital communication networks. There is a need, therefore, for a method of optimizing the performance of such networks. Further, there is a need for such a method that works automatically and is broadly applicable with respect to variable network parameters. Moreover, there is a need for such a method that allows for in-service optimization of both single-channel and multi-channel digital communication networks.

OBJECTS AND ADVANTAGES

Accordingly, it is a primary object of the present invention to provide a method of optimizing the performance of digital communication networks. Further, it is an object of the invention to provide such a method that works automatically and is broadly applicable with respect to variable network parameters. Moreover, it is an object of the invention to provide such a method that allows for in-service optimization of both single-channel and multi-channel digital communication networks.

SUMMARY

In accordance with embodiments of the invention, a method of optimizing the performance of digital communication networks is described. The method measures the line bit error rate (BER) at a receiver by counting corrected errors, as reported by a forward error correction (FEC) decoder, and adjusts network parameters to minimize the corrected error rate. The method can be applied to any digital communication network, and has particular applicability for fiber optic communication networks. Additionally, the method can be applied to multi-channel networks, including fiber optic networks having multiple transmitters, receivers, and variable parameters, to balance the performances of different channels. The method can also minimize interchannel crosstalk, by optimizing the corrected errors as multiplexing parameters are adjusted. The method can for example optimize the signal wavelengths in a wavelength division multiplexed (WDM) network.

Embodiments of the present invention provide methods for in-service optimization of various adjustable parameters in an optical communication network. Adjustable parameters include, among other things, transmitter wavelength, transmitter power, transmitter extinction ratio, transmitter polarization, and dispersion of a dispersion compensator.

The methods include sweeping an adjustable parameter while monitoring the FEC corrected bit error rates at the receiver(s). By measuring the line BER versus the value of the adjustable parameter, the optimum value of a given parameter can be extrapolated. Since the FEC corrects for the line errors, as long as the line BER is low enough, no bit errors will be produced. Accordingly, a parameter can be adjusted while the network is in-service, for example at regular maintenance intervals or at an upgrade of the network. If the BER exceeds a level such that it is no longer correctable by the FEC, e.g.>$10^{-3}$, e.g., when the digital communication network is installed, then the parameter adjustment is performed out-of-service.

In an embodiment of the present invention, a variable parameter is adjusted by increasing the parameter from a predetermined nominal operating value until the corrected FEC errors at the receiver reach a predetermined BER limit. Then the parameter is decreased from the nominal operating value until the corrected FEC errors again reach the predetermined BER limit. In this way, the corrected BER is maintained below the predetermined BER limit while the digital communication network is in-service.

In a multi-channel digital communication network, for example a multi-channel fiber optic network sharing a common optical amplifier among multiple channels, the channels are balanced by adjusting a plurality of variable parameters, while monitoring the corrected FEC errors at each receiver. The value of each parameter at which each respective receiver reaches a predetermined BER limit is determined, and the values of the respective parameters are extrapolated, such that each transmitter-receiver channel has an equal relative power difference above the BER limit.

When a new channel is added to the network, its performance is balanced with the existing channels by decreasing the transmitter power of the new channel until the BER at the new channel receiver reaches the predetermined BER limit of the existing network channels. Then the transmitter power of the new channel is set such that the relative transmitter power difference from the power at the BER limit of the new channel equals the relative transmitter power difference from the respective transmitter powers at the respective BER limits of the existing channels.

The present invention is better understood upon consideration of the detailed description below, in conjunction with the accompanying drawings.

BRIEF DESCRIPTION OF THE FIGURES

The present invention may be better understood, and its numerous objects, features, and advantages made apparent to those skilled in the art by referencing the accompanying drawings. For simplicity and ease of understanding, the use of similar reference symbols in different drawings indicates similar or identical items.

DETAILED DESCRIPTION

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

Figure 1A:
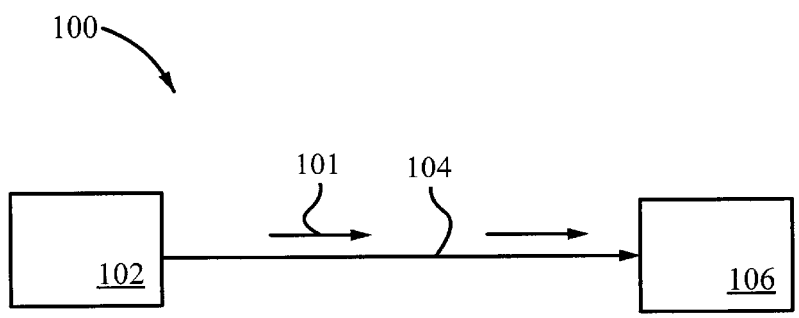
FIG. 1A is a simplified schematic diagram of a conventional single-channel digital communication network.
Figure 1B:
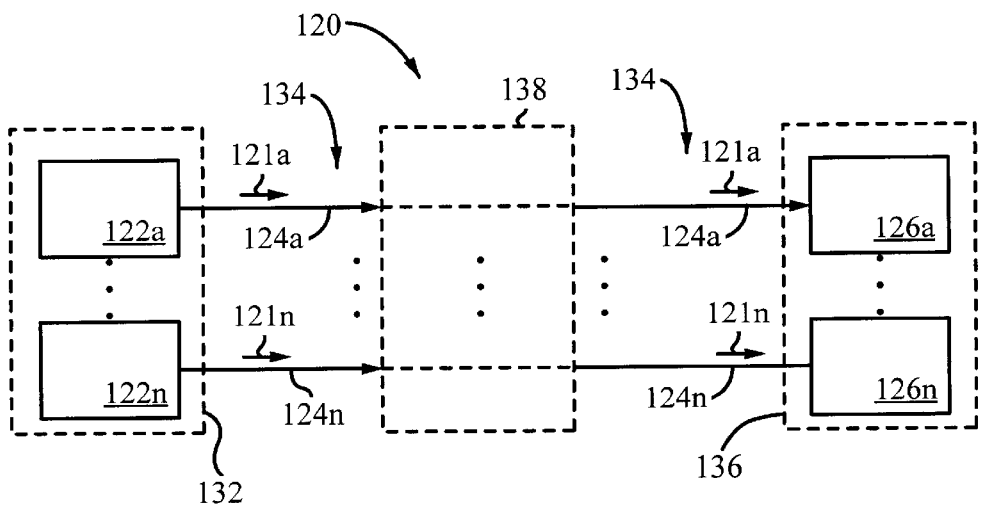
FIG. 1B is a simplified schematic diagram of a conventional multi-channel digital communication network.
Figure 2:
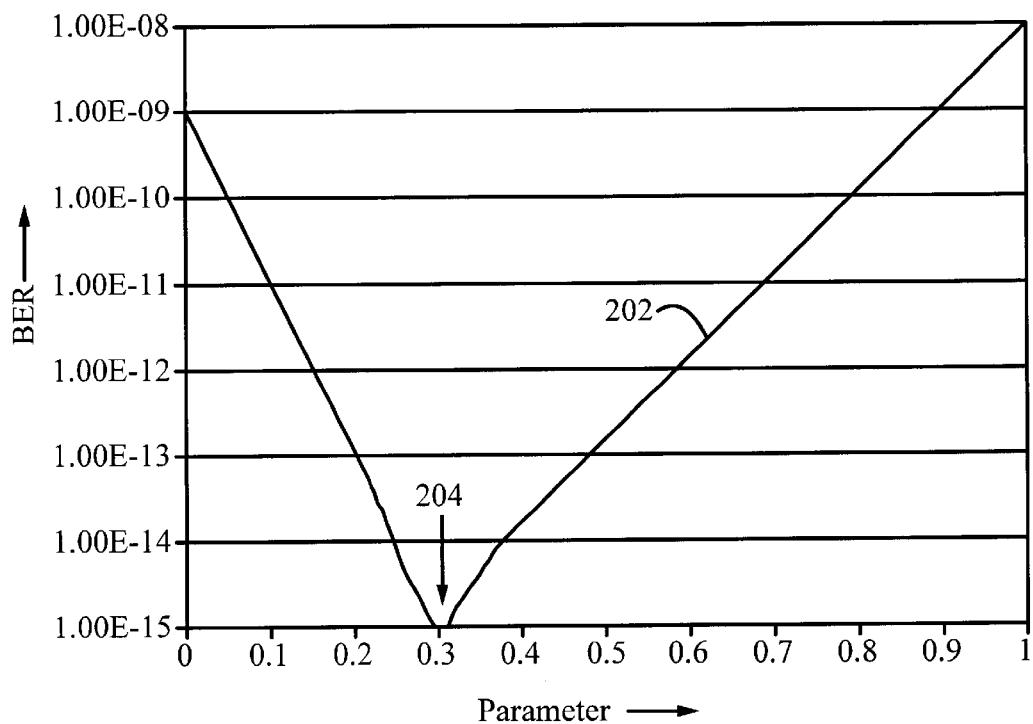
FIG. 2 is a graphic representation illustrating an example of line BER vs. a variable parameter.

FIG. 2 is a graphic representation illustrating an example of line BER vs. a variable parameter. A solid curve 202 represents the dependence of line BER along the vertical axis vs. the value of the parameter along the horizontal axis. In this case, after the BER has been measured vs. the parameter, the parameter can be set at approximately 0.3 (indicated by an arrow 204) to minimize the line BER, and hence maximize the system operating margin. This measurement can be done constantly by dithering the parameter, or on a regular basis to adjust for aging and temperature variations that affect the system performance. Since the slope of curve 202 has differing absolute values on either side of the optimum value, the optimum parameter value is ideally found by measuring the BER vs. the parameter at several points on either side of the optimum value, fitting a curve to the measured values, and extrapolating to the optimum value.

The performance of a channel in a WDM network depends at least in part on how well the transmitter wavelength is centered on the corresponding channel filter pass band. Even if the transmitter wavelength is centered on the filter at installation of the channel, temperature and aging effects can cause the transmitter and filter to drift relative to one another. This drift can be tracked and compensated for by sweeping the transmitter wavelength across the filter pass band, while monitoring the receiver BER. For standard Distributed Feedback (DFB) lasers, for example, the wavelength can be swept by adjusting the laser temperature. This process requires an administrative communications link between the transmitter and receiver that enables the software to measure the line BER vs. the transmitter wavelength.

Figure 3:
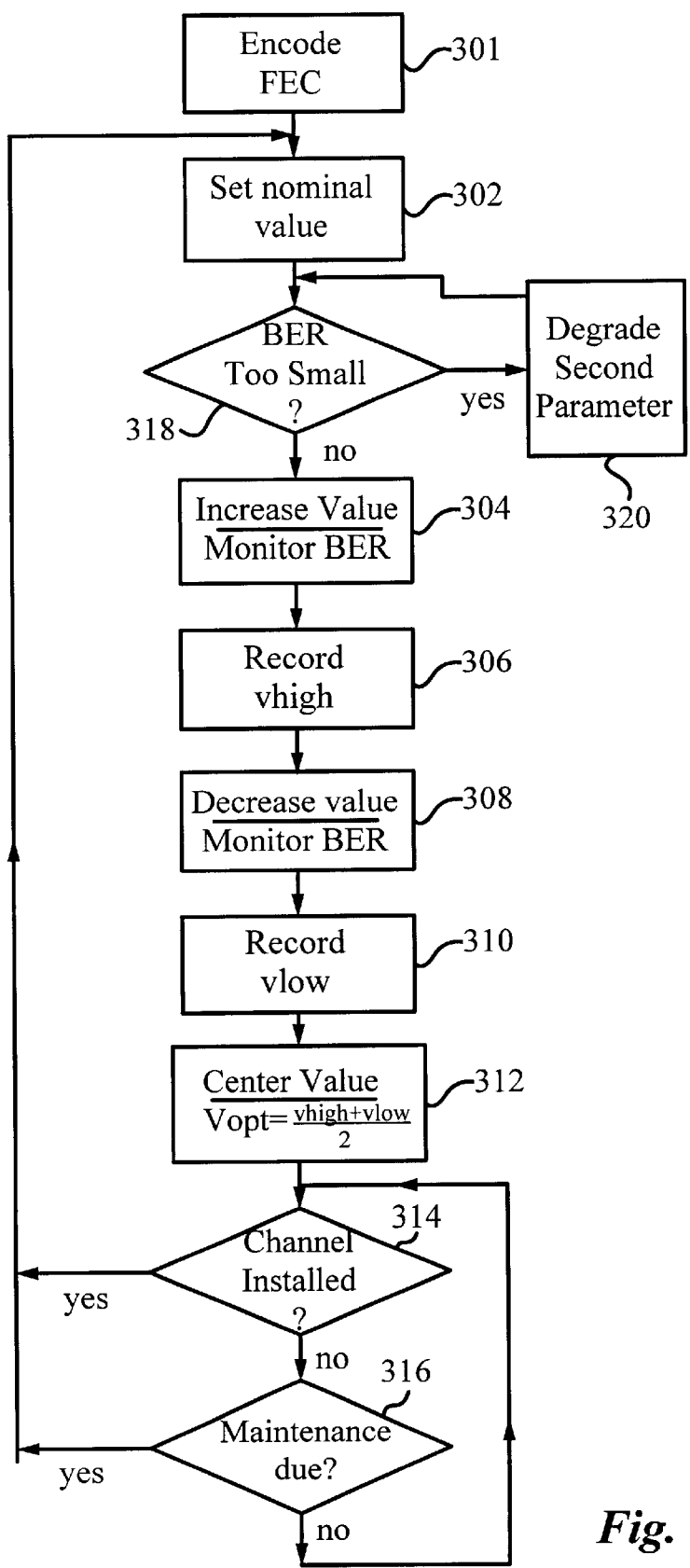
FIG. 3 is a generalized flow diagram illustrating software parameter optimization according to an embodiment of the invention.

FIG. 3 is a generalized flow diagram illustrating software parameter optimization according to an embodiment of the invention. At step 301, forward error correction (FEC) is encoded at the transmitter. At step 302, the parameter (e.g., transmitter wavelength) is set initially at its nominal value, where it is assumed that the line BER is close to its optimum value. At step 304 the value of the parameter (e.g., transmitter wavelength) is then steadily increased while monitoring the FEC corrected BER at the receiver, until a nominal high line BER limit is encountered, e.g., $10^{-6}$. At step 306 the parameter value reached at step 304 is recorded as a high parameter value (e.g., long transmitter wavelength) limit vhigh. At step 308 the parameter value (e.g., transmitter wavelength) is gradually decreased while monitoring the BER, until the nominal high line BER limit is again encountered. At step 310 the value of the parameter (e.g., short transmitter wavelength) at the BER limit reached at step 308 is recorded as a low parameter value limit vlow. At step 312 the parameter is centered at an optimized value vopt=(vhigh+vlow)/2. As shown in conditional steps 314 and 316, this procedure of optimizing the parameter can be performed automatically when each wavelength channel is installed in the communication network, and at regular maintenance intervals to compensate for long-term aging and temperature drifts.

Many cases of parameter adjustment will be in the regime where the line BER is still too small to measure quickly. In these cases, a second parameter can be degraded while the first parameter is adjusted. The second parameter must be degraded so that the line BER is in a measurable regime, but not degraded to the extent that the introduced errors cannot be corrected. This procedure is illustrated in steps 318 and 320 of the flow diagram FIG. 3. For example, this can be done by reducing the transmitter or amplifier power. Particularly, if power-controlled Erbium-doped Fiber Amplifiers (EDFAs) are used in a WDM system, then the power-reduction method is ideally performed such that the gain during the adjustment phase is comparable with the operating gain. In this way the dynamic gain tilt (amplifier gain variation) does not affect the adjustment procedure. The procedure for this adjustment depends on whether it is done in-service, or during the initial installation or upgrade.

The generalized FEC procedure illustrated in FIG. 3 can be applied to optimize transmitter wavelength relative to filter wavelength center. Alternatively, if the filter wavelength can be tuned, for example by adjusting filter temperature, then a similar generalized FEC procedure can be applied to optimize the filter wavelength relative to the transmitter wavelength. Described below are various other system parameters that can be optimized by monitoring the FEC corrected line BER, in accordance with procedures similar to those illustrate in FIG. 3.

Transmission distances in an optical fiber can be limited by dispersion, distortion, received power, or received noise. If a channel transmission distance in a digital optical network is limited by received power or noise, then it is typically optimized by maximizing the launch power of its transmitter. However, if the channel transmission distance is limited by nonlinear effects at higher powers, e.g., limited by self-phase modulation or stimulated Brillouin scattering, then there is an optimum launch power that minimizes the BER. Decreasing the launch power below its optimum value reduces the received power in the launch power limited regime, whereas increasing the launch power above its optimum value increases the received signal distortion caused by nonlinear effects. Nonlinear effects become more significant as the bit rate increases. Additionally, in a WDM network the BER of a channel is affected by the powers in neighboring channels through nonlinear effects such as cross-phase modulation, four-wave mixing, and Raman scattering.

Similarly, there is an optimum extinction ratio for a given optical fiber length. Increasing the extinction ratio at the receiver increases the signal-to-noise ratio, but as the transmitter extinction ratio increases, transient chirp and pulse distortion also increase. Transient chirp and distortion increase the dispersion penalty at the receiver; therefore, a transmitter has an optimum extinction ratio that depends on the length of the fiber. If the transmitter chirp is independently adjustable, as for some external modulators, then it can also be optimized through the method of the present invention.

For a given fiber installation, the ideal launch power and extinction ratio can be determined by monitoring the line BER at the receiver, as the extinction ratio is increased from a very small value. The line BER decreases, then increases, as the dispersion limit is reached. By measuring the line BER vs. the extinction ratio, the optimized extinction ratio can be determined when a channel is installed. Thereafter, the adjustment can be performed at regular maintenance intervals to compensate for aging of the transmitter.

As described above, in a high-power single-channel system that is limited by launch power, the transmitter power can be adjusted while the line BER is monitored to determine the optimum launch power. The relative launch powers of the transmitters in a WDM system can likewise be optimized. In an amplified WDM network, the system performance depends on the launch powers of the various transmitter signals, because the signals share the amplifier gain. If the amplifiers are operated in a gain-control mode, the stronger transmitter powers must be reduced so that the stronger channels do not saturate the amplifiers. On the other hand, if the amplifiers are operated in a power-control mode, the channel powers must be adjusted to equalize the BERs of the channels. The adjustment of the channel powers can be done by adjusting each transmitter in sequence, while monitoring the line BER at the receiver. This adjustment is performed when the WDM system is installed or when a channel is added to an existing system.

Figure 4:
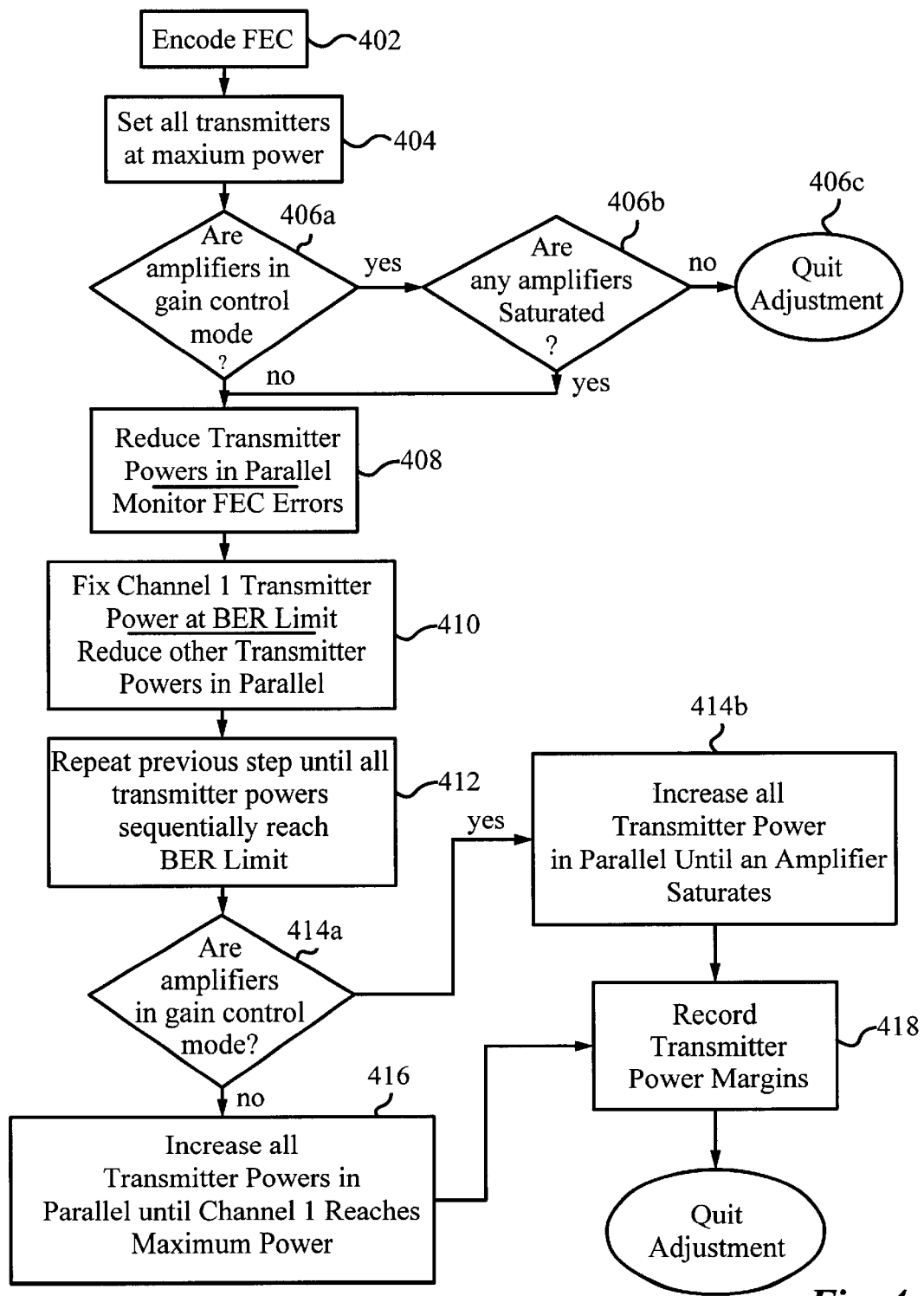
FIG. 4 is a simplified flow diagram illustrating transmitter power optimization in a WDM network, according to embodiments of the present invention.

FIG. 4 is a simplified flow diagram illustrating transmitter power optimization in a WDM network, according to embodiments of the present invention. Forward error correction (FEC) is encoded at the transmitters at step 402. All transmitter powers are set at maximum power at step 404. When a WDM network is installed with optical amplifiers operating in fixed gain control mode and if none of the amplifiers is saturated when all transmitters are initially operated at maximum power, then no adjustment is required, as illustrated at steps 406a–406c. However, if a gain control mode amplifier saturates or if a WDM network is installed with optical amplifiers operating in fixed power control mode, then the transmitter powers are reduced in parallel while monitoring the FEC corrected errors at the receivers at step 408, until the line BER of any given channel (hereinafter called Channel 1) increases to a predetermined limit (e.g., $10^{-5}$). Fixing the transmitter power of Channel 1 at the value corresponding to the BER limit, other channel transmitter powers are reduced in parallel, as illustrated at step 410. As each channel sequentially reaches the BER limit, the corresponding transmitter is fixed at the power that gives the same BER limit, as illustrated at step 412.

After all channels have reached the BER limit, then all transmitter powers are increased in parallel until an amplifier reaches its maximum power, in the case of power control mode operation, as shown at steps 414a and 416. Alternatively, in the case of gain control mode operation, all channel powers are increased in parallel until an amplifier saturates, as illustrated at step 414b. The respective amplifier powers are now optimized at their present operating points. Preferably, the power difference for each channel transmitter between its operating point and the BER limit point is recorded, as illustrated at step 418. Then, when new channels are added to the network, their transmitter powers can be adjusted to the same margin above the BER limit as the existing transmitter powers.

In a long-haul optical fiber network, dispersion compensators may be required to support propagation beyond the rated dispersion limit of the transmitters. For such an application, dispersion compensators can be used to support the propagation without regeneration. The amount of compensation required depends on the total fiber dispersion and on dispersion-dependent nonlinear effects, such as cross-phase modulation in a WDM network. Since the dispersion parameters of an installed fiber are usually not accurately known, it is desirable to have adjustable dispersion compensators that can be set depending on the application. The optimum setting for the dispersion compensating module (DCM) can also be determined by monitoring the line BER in accordance with embodiments of the present invention. A method for adjusting the dispersion compensation is described in U.S. application Ser. No. 09/5778,996 "Adjustable Dispersion Compensation Module," by C. Barnard, cited above.

The line BER can be measured by counting the corrected errors as a function of the dispersion compensation so that the optimum dispersion compensation can be found. If the BER is still too small to measure, then the transmitter power can be reduced to bring the BER into a regime where it can be measured quickly.

Methods have been proposed to monitor and compensate for transmission degradations caused by polarization mode dispersion in optical fibers (see Ono, U.S. Pat. No. 5,473,457, issued Dec. 5, 1995; and Roberts et al., U.S. Pat. No. 5,949,560, issued Sep. 7, 1999), but they have not employed FEC to monitor the degradation. If there is a means of adjusting the launch polarization of the transmitter, as suggested in Roberts et al., U.S. Pat. No. 5,949,560, cited above, then it can be adjusted while monitoring the line BER with FEC to optimize the launch polarization. Note that optimizing the transmitter polarization will be affected by polarization-dependent gain and loss, so the polarization setting will be the one that gives the minimum combined penalty.

Figure 5:
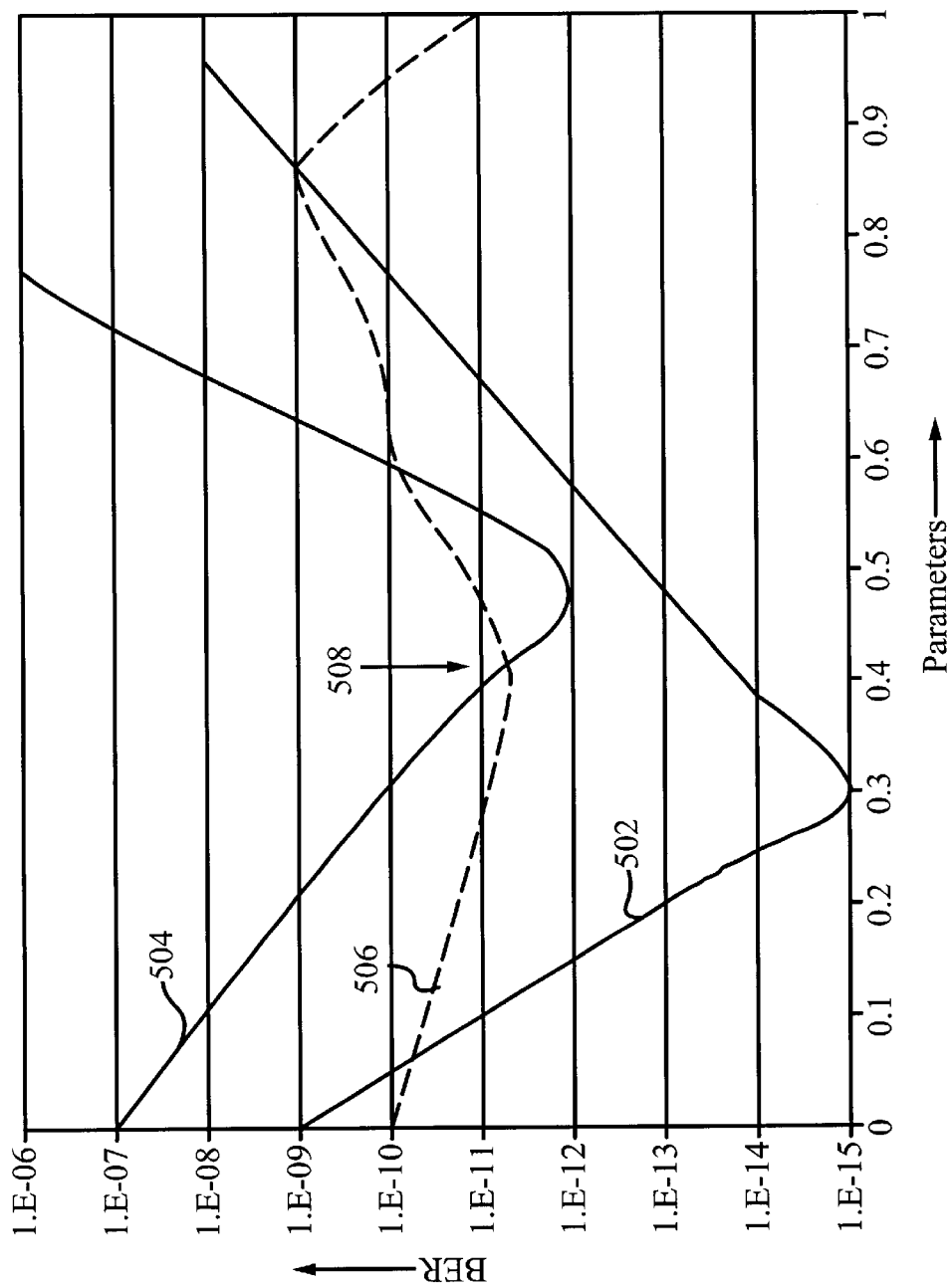
FIG. 5 is a graphic representation illustrating received line BERs for three simultaneously monitored channels vs. a variable parameter.

In a multi-channel system, e.g., a WDM optical system, one parameter can affect one, several, or all the received signals. FIG. 5 is a graphic representation illustrating received line BERs for three simultaneously monitored channels vs. a variable parameter in curves 502, 504, and 506. In this case, the optimum parameter value is the one that minimizes the worst-case BER, namely that shown in curve 506. As illustrated in FIG. 5, the optimum parameter value is 0.42, as indicated by an arrow 508.

It will be clear to one skilled in the art that the above embodiment may be altered in many ways without departing from the scope of the invention. Accordingly, the scope of the invention should be determined by the following claims and their legal equivalents.

What is claimed is:

1. A method of optimizing a digital communication network having a transmitter, a receiver, and a variable parameter, said method comprising:
   encoding forward error correction (FEC) at said transmitter;
   adjusting said variable parameter;
   decoding the FEC and monitoring corrected FEC errors at said receiver during adjustment of said variable parameter; and
   extrapolating said variable parameter to a value that substantially minimizes the corrected FEC errors.

2. The method of claim 1, wherein said digital communication network comprises a fiber optic communication network.

3. The method of claim 2, wherein said fiber optic communication network comprises a wavelength division multiplexed (WDM) fiber optic communication network.

4. The method of claim 1, wherein said variable parameter is adjusted when said digital communication network is installed.

5. The method of claim 1, wherein said variable parameter is adjusted when said digital communication network is in-service.

6. The method of claim 5, wherein the adjusting of said variable parameter comprises:
   increasing said variable parameter from a predetermined operating value until the corrected FEC errors at said receiver reach a predetermined bit-error ratio (BER) limit; then
   decreasing said variable parameter from said predetermined operating value until the corrected FEC errors at said receiver reach said predetermined BER limit, thereby maintaining the corrected BER below said predetermined BER limit while said digital communication network is in-service.

7. The method of claim 1, wherein said variable parameter is adjusted at an upgrade of said digital communication network.

8. The method of claim 1, wherein said variable parameter is selected from the group consisting of transmitter wavelength, transmitter power, transmitter extinction ratio, transmitter polarization, center wavelength of a tunable filter, and dispersion of a dispersion compensator.

9. The method of claim 1, wherein said digital communication network comprises a multi-channel digital communication network having a plurality of transmitters, receivers, and variable parameters.

10. The method of claim 9, wherein said multi-channel digital communication network comprises a multi-channel fiber optic communication network, such that said multiple channels share a common optical amplifier.

11. The method of claim 9, further comprising:
   adjusting a plurality of variable parameters, each of said plurality of variable parameters being associated with a transmitter-receiver channel;
   monitoring corrected FEC errors at each of said plurality of receivers during adjustment of a corresponding one of said plurality of variable parameters; and
   determining the value of each of said plurality of variable parameters at the corresponding receiver reaches a predetermined BER limit, wherein
   said extrapolating step extrapolates one of said plurality of variable parameters and determines values the other variable parameters, such that each transmitter-receiver channel has an equal relative power difference between an operating point and the BER limit.

12. The method of claim 11, wherein said plurality of variable parameters are selected from the group consisting of transmitter powers and transmitter wavelengths.

13. The method of claim 11, further comprising adding a new transmitter-receiver channel to said digital communication network, wherein said adding includes decreasing the transmitter power of said new channel until the BER at the receiver of said new channel reaches the predetermined BER limit of the existing network channels, and then setting the transmitter power of the new channel, such that the relative transmitter power difference from the transmitter power at the predetermined BER limit of the new channel equals the relative transmitter power difference from the respective transmitter powers at the respective BER limits of the existing channels.

14. The method of claim 1, wherein the extrapolating step extrapolates said variable parameter based on a correlation between the monitored corrected FEC errors and the adjustment of said variable parameter.

15. A system for optimizing a digital communication network, comprising:
   a transmitter configured to encode forward error correction (FEC);

means for adjusting a variable parameter associated with the digital communication network;

a receiver, which includes
means for decoding said FEC encoded by the transmitter, and
means for monitoring corrected FEC errors while said variable parameter is adjusted to determine a correlation; and means for calculating a value of said variable parameter, based on said correlation, which substantially minimizes corrected FEC errors.

16. The system of claim 15, said system being implemented in a fiber optical communication network.

17. The system of claim 16, wherein said fiber optical network is a wavelength division multiplexed (WDM) fiber optic communication network.

18. The system of claim 15, wherein said means for adjusting said variable parameter includes,
means for increasing said variable parameter from a predetermined operating value until the corrected FEC errors at said receiver reach a predetermined bit-error ratio (BER) limit; and
means for decreasing said variable parameter from said predetermined operating value until the corrected FEC errors at said receiver reach said predetermined BER limit, thereby maintaining the corrected BER below said predetermined BER limit while said digital communication network is in-service.

19. The system of claim 15, further comprising:
a plurality of transmitters, receivers, and channels, wherein
each channel connects a corresponding one of the transmitters to a corresponding one of the receivers, and
said plurality of channels share an optical amplifier.

20. The system of claim 19, wherein
said means for adjusting are operable to adjust a plurality of variable parameters, and
said system further comprises:
means for monitoring corrected FEC errors at each of said plurality of receivers during the adjustment of a corresponding one of said plurality of variable parameters;
means for determining the value of each of said plurality of variable parameters at which the corresponding receiver reaches a predetermined BER limit, wherein
said means for extrapolating are operable to extrapolate one of the variable parameters and determine values for the other variable parameters, such that each transmitter-receiver channel has an equal relative power difference between an operating point and the BER limit.

21. A method for adjusting parameters in a digital communication network, comprising:
decoding forward error correction (FEC) at a receiver while adjusting a variable parameter, said FEC being encoded at a transmitter;
monitoring corrected forward error correction (FEC) errors at said receiver to determine a correlation between said corrected FEC errors and said adjustments to said variable parameter; and
calculating a value of said variable parameter based on said correlation to substantially minimize said corrected FEC errors.

22. The method of claim 21, further comprising:
increasing said variable parameter, while the digital communication network is in-service, from a predetermined operating value until said monitoring step indicates that said receiver achieves a predetermined error rate; and
decreasing said variable parameter, while the digital communication network is in-service, from said predetermined operating value until said monitoring step indicates that said receiver achieves said predetermined error rate.

23. The method of claim 21, wherein
the decoding step decodes, at each of a plurality of receivers, an FEC encoded by a corresponding one of a plurality of transmitters, each receiver being associated with a variable parameter,
the monitoring step monitors, at each of said plurality of receivers, corrected FEC errors while said associated variable parameter is adjusted until a predetermined error rate is achieved, and
the calculating step includes,
calculating a value of a variable parameter associated with a chosen receiver that substantially minimizes said corrected FEC errors,
calculating values for variable parameters associated with the other receivers so that said calculated values for said plurality of variable parameters each has an identical relative difference with respect to a value associated with said predetermined error rate.

* * * * *